United States Patent
Lee et al.

(10) Patent No.: US 8,043,876 B2
(45) Date of Patent: Oct. 25, 2011

(54) LIGHT EMITTING DIODE PACKAGE AND MANUFACTURING METHOD THEREOF

(75) Inventors: Hwa-Young Lee, Suwon-si (KR); Ho-Joon Park, Seoul (KR); Jin Cheol Kim, Hwaseong-si (KR); Sang-Jun Yoon, Seoul (KR); Geum-Hee Yun, Yongin-si (KR); Jun-Rok Oh, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 331 days.

(21) Appl. No.: 12/285,228

(22) Filed: Sep. 30, 2008

(65) Prior Publication Data
US 2009/0189177 A1    Jul. 30, 2009

(30) Foreign Application Priority Data
Jan. 24, 2008    (KR) .................. 10-2008-0007332

(51) Int. Cl.
*H01L 21/00* (2006.01)
(52) U.S. Cl. ............ 438/28; 438/26; 438/110; 438/126
(58) Field of Classification Search .............. 438/26, 438/28, 110, 126
See application file for complete search history.

(56) References Cited

U.S. PATENT DOCUMENTS

| 6,730,533 | B2 | 5/2004 | Durocher et al. | |
| 7,332,746 | B1* | 2/2008 | Takahashi et al. | 257/98 |
| 7,708,427 | B2* | 5/2010 | Baroky et al. | 362/238 |
| 7,736,020 | B2* | 6/2010 | Baroky et al. | 362/249.02 |

FOREIGN PATENT DOCUMENTS

| JP | 6-350206 | 12/1994 |
| JP | 2000-77822 | 3/2000 |
| JP | 2007-220843 | 8/2007 |
| JP | 2007-311736 | 11/2007 |

OTHER PUBLICATIONS

Korean Office Action issued Nov. 24, 2009 in corresponding Korean Patent Application 10-2008-0007332.
Japanese Office Action issued Jul. 19, 2011 in corresponding Japanese Patent Application 2008-260957.

* cited by examiner

*Primary Examiner* — Zandra Smith
*Assistant Examiner* — Christy Novacek

(57) ABSTRACT

Disclosed are a light emitting diode package and a manufacturing method thereof. According to an embodiment of the present invention, the method includes: manufacturing a package main body having a plurality of cavities, the cavities being formed in a line on one surface, through molding by putting thermoplastic polymer into a previously produced mold; forming an electrode passing through the package main body; mounting a light emitting diode chip on a basal surface of the each cavity formed in the package main body; connecting electrically the light emitting diode chip and the electrode by using a bonding means; and sealing the light emitting diode chip and the bonding means by using a molding resin.

17 Claims, 17 Drawing Sheets

LIGHT EMITTING DIODE PACKAGE AND MANUFACTURING METHOD THEREOF

CROSS-REFERENCE TO RELATED APPLICATIONS

This application claims the benefit of Korean Patent Application No. 10-2008-0007332, filed with the Korean Intellectual Property Office on Jan. 24 2008, the disclosure of which is incorporated herein by reference in its entirety.

BACKGROUND

1. Technical Field

The present invention relates to a light emitting device, more particularly to a light emitting diode package manufactured by putting thermoplastic polymer into a previously produced mold and by using a compression molding method or an injection molding method, and a manufacturing method thereof.

2. Description of the Related Art

With a light emitting diode (LED), wide markets related to a signboard, a display, an automobile, a signal light, a backlight and general illumination are now being formed. The LED market is steadily growing in each of the application fields. Particularly, various small-sized display devices having a low energy consumption rate are recently developed and a liquid Crystal Display (LCD) is popular with display devices, for example, a monitor, a laptop computer and a mobile communication terminal and the like. However, since the LCD cannot voluntarily generate a light beam, it is common to include a backlight used as a light source generating a light beam on the rear surface or the side surface of the LCD panel. A cold cathod fluorescent lamp (CCFL) and the LED are mainly used as such a backlight light source.

But, since the CCFL uses mercury vapor, the CCFL has disadvantages in that it may cause environmental pollution, has a slow response speed and poor color reproductivity and is not suitable for causing the backlight light source to be light, thin, short and small due to the big size thereof.

In comparison with this, the LED has advantages in that it is environmentally friendly and has a high response speed of several nanoseconds, a long life and high crashworthiness. The LED can freely change luminance and color temperature, etc. by adjusting the light amount of red, green and blue LEDs so that it has superb color reproductivity and is more suitable for causing the backlight light source to be light, thin, short and small. Accordingly, a side light emitting type LED package adopting the LED is mainly used as a backlight light source used in small-sized devices such as a mobile phone, a car navigation system and a PMP and so on.

Such an LED package for the backlight light source should include design flexibility capable of increasing the angle of orientation for maximizing the efficiency of an LED chip, and should be able to mount a large number of the LEDs in order to acquire the certain brightness. As electronic communication devices and display devices are smaller and thinner, the LED package is required to be thinner and lighter and the material cost and process cost is also required to be reduced.

FIG. 1 illustrates a side view of the structure of an LED package adopting a lead frame structure according to the related art.

Referring to FIG. 1, an LED package adopting the lead frame structure according to the related art is manufactured by mounting the LED chip 40 on the upper surface of a lead frame 20, and then performing wire bonding 50 and injecting molding resin 60 into the inside of injection molded products 10 and 30 surrounding the lead frame 20. However, in the LED package adopting the lead frame as illustrated in FIG. 1, there are problems in that it is difficult to cause the LED package to be light and thin due to the weight of the lead frame, and total material cost rises because of the high price of own lead frame. Also, there is a problem in that there is a limit in increasing the angle of orientation (light-emitting angle) of the LED package owing to the significant restriction for chip design, which is caused by an arrangement of the lead frame.

In order to solve such problems, an LED package using low temperature co-fired ceramic (LTCC) is provided in substitution for the lead frame structure mentioned above. FIG. 2 illustrates a side view of the structure of an LED package using low temperature co-fired ceramic (LTCC) according to the related art.

Referring to FIG. 2, the LED package using LTCC includes a lower ceramic sheet 11, electrode 21, an upper ceramic sheet 31, a reflector 32, an LED chip 41, a wire-bonding, 51 and molding resin 61. However, even though such an LED package using LTCC can be replaced with the conventional lead frame structure in that cavity process can be applied to the LED package using LTCC by punching, and the LED package can be made by the lamination process of numerous ceramic sheets, there are still the following problems.

First, since the LED package using LTCC makes use of a ceramic substrate, the material cost thereof is high. It is difficult to mount numbers of LED chips on one substrate because the larger the size of the substrate is, the higher the possibility of occurrence of crack is. In addition, since the ceramic substrate has a different coefficient of thermal expansion from that of the molding resin, errors such as separation of the wire bonding may occur.

Additionally, since the LED package using LTCC adopts the existing ceramic substrate process as it stands when manufacturing the package, the LED package manufacturing process is complicated. This can be easily cleared through a flowchart of an LED package manufacturing method using LTCC illustrated in FIG. 3.

In step of S10 in FIG. 3, an upper ceramic sheet 31 having a through portion at the central part thereof is manufactured with the ceramic sheet 31A previously prepared through the cutting process by means of a punching process or a laser drill. In step of S20 in FIG. 3, the electrode 21 is formed on the lower ceramic sheet 11.

In step S30 of FIG. 3, the upper ceramic sheet 31 is laminated on the upper side of the lower ceramic sheet 11 having the electrode 21. A space for mounting the LED chip 41 in the future, that is, a cavity is formed on the upper surface of the lower ceramic sheet 11 through such a lamination process. In step of S40 in FIG. 3, the lower ceramic sheet 11 and the upper ceramic sheet 31 are fired.

In step of S50 in FIG. 3, the reflectors 32 are formed on the side walls of the upper ceramic sheet 31. In step of S60 in FIG. 3, the LED chip 41 is mounted in the cavity formed on the upper surface of the lower ceramic sheet 11, and the wire bonding 51 is performed so that the LED chip 41 is electrically connected to the electrode 21. In step of S70 in FIG. 3, the cavity formed on the upper surface of the lower ceramic sheet 11 is filled with molding resin 61 so that the LED chip 41 and the wire bonding 51 are fixed and sealed.

As described above, in the case of the LED package manufacturing method using LTCC, it can be seen that many procedures, that is, the punching/cutting process, the lamination process and the firing process, should be applied in the order specified so as to form the cavity, i.e., a space for mounting the LED chip 41. Also, in the cavity manufactured by the punching/cutting process and the lamination process, the boundary surface thereof always forms a right angle so that it is hard to obtain the wide angle of orientation (light-emitting angle) in the LED package.

SUMMARY

The present invention provides a light emitting diode package that can implement flexibility of plan and design for a light source package, increase the angle of orientation and cause the light source package to be light, thin and small, and provides a manufacturing method thereof, when manufacturing the light source package by using a light emitting diode.

The present invention also provides a light emitting diode package that can reduce the material cost and simplify the process, and provides a manufacturing method thereof when manufacturing the light source package by using a light emitting diode.

The present invention also provides a light emitting diode package that can greatly improve light emission intensity and light emission efficiency, and provides the manufacturing method thereof when manufacturing the light source package by using a light emitting diode.

An aspect of the present invention features a light emitting diode package manufacturing method. The method in accordance with an embodiment of the present invention can include: manufacturing a package main body having a plurality of cavities, the cavities being formed in a line on one surface, through molding by putting thermoplastic polymer into a previously produced mold; forming an electrode passing through the package main body; mounting a light emitting diode chip on a basal surface of the each cavity formed in the package main body; connecting electrically the light emitting diode chip and the electrode by using a bonding means; and sealing the light emitting diode chip and the bonding means by using a molding resin.

The package main body can be manufactured by putting powdered thermoplastic polymer into the mold and by using a compression molding method.

The package main body can be manufactured by putting molten thermoplastic polymer into the mold and by using an injection molding method.

The package main body can be molded and manufactured such that an inclined plane is formed on a side wall located between some two adjacent cavities thereof.

The method can further include, before forming the electrode, forming a through hole at a position of the electrode intended to be formed in the package main body through a drilling process.

A through hole is formed in correspondence with the position of the electrode intended to be formed in the package main body, whereas the through hole can be molded simultaneously with the package main body in a manufacturing process of the package main body.

The thermoplastic polymer can be one of materials such as liquid crystal polymer (LCP), polyetherimide (PEI), Polyethersulfone (PES), Polyetheretherketone (PEEK) and polytetrafluoroethylene (PTFE), or can be formed through combination thereof.

The package main body can be formed of the thermoplastic polymer with the addition of ceramic filler.

The method can include applying fluorescent substance on an upper side of the molding resin.

The package main body is manufactured in the form of a bar type, whereas the plurality of cavities can be formed in a line on one surface of the package main body.

Another aspect of the present invention features a light emitting diode package manufacturing method. The method in accordance with an embodiment of the present invention can include: manufacturing a package main body having a plurality of through portions, the through portions being formed in a line, through molding by putting thermoplastic polymer into a previously produced mold; forming an electrode passing through the package main body at a different position from a position of formation of the through portion; adhering an adhesive tape to one surface of the package main body such that a closed side is formed to one side of each through hole; mounting a light emitting diode chip on the closed side formed in each through portion; connecting electrically the light emitting diode chip and the electrode by using a bonding means; and sealing the light emitting diode chip and the bonding means by using a molding resin.

The package main body can be manufactured by putting powdered thermoplastic polymer into the mold and by using a compression molding method.

The package main body can be manufactured by putting molten thermoplastic polymer into the mold and by using an injection molding method.

The method can further include, before forming the electrode, forming a through hole at a position of the electrode intended to be formed in the package main body through a drilling process.

A through hole is formed in correspondence with the position of the electrode intended to be formed in the package main body, whereas the through hole can be molded simultaneously with the package main body in a manufacturing process of the package main body.

The thermoplastic polymer can be one of materials such as liquid crystal polymer (LCP), polyetherimide (PEI), Polyethersulfone (PES), Polyetheretherketone (PEEK) and polytetrafluoroethylene (PTFE), or can be formed through combination thereof.

The package main body can be formed of the thermoplastic polymer with the addition of ceramic filler.

The method can include, after sealing the light emitting diode and the bonding means, removing the adhesive tape and applying fluorescent substance on a surface from which the adhesive tape is removed.

The package main body is manufactured in the form of a bar type, whereas the plurality of through portions can be formed in a line in the package main body.

Yet another aspect of the present invention features a light emitting diode package. The light emitting diode package in accordance with an embodiment of the present invention can include: a package main body formed of thermoplastic polymer and in the form of a bar type, a plurality of cavities being formed in a line on one surface thereof; an electrode connected to an external power supply by passing through the package main body; a light emitting diode chip mounted on a basal surface of each cavity formed in the package main body, and connected electrically to the electrode through a bonding means; and a molding part sealing the light emitting diode chip and the bonding means.

The thermoplastic polymer can be one of materials such as liquid crystal polymer (LCP), polyetherimide (PEI), Polyethersulfone (PES), Polyetheretherketone (PEEK) and polytetrafluoroethylene (PTFE), or can be formed through combination thereof.

The package main body can be formed of the thermoplastic polymer with the addition of ceramic filler.

The light emitting diode package further includes a fluorescent layer formed on a light emitting surface of the light emitting diode package, whereas the light emitting surface can correspond to an upper side of the molding part or a basal surface of the cavity.

DETAILED DESCRIPTION

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. In the following description of the present invention, the detailed description of known technologies incorporated herein will be omitted when it may make the subject matter unclear.

Terms such as "first" and "second" can be used in describing various elements, but the above elements shall not be restricted to the above terms. The above terms are used only to distinguish one element from the other. For instance, the first element can be named the second element, and vice versa, without departing the scope of claims of the present invention. The term "and/or" shall include the combination of a plurality of listed items or any of the plurality of listed items.

When one element is described as being "connected" or "accessed" to another element, it shall be construed as being connected or accessed to the other element directly but also as possibly having another element in between. On the other hand, if one element is described as being "directly connected" or "directly accessed" to another element, it shall be construed that there is no other element in between.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Unless otherwise defined, all terms, including technical terms and scientific terms, used herein have the same meaning as how they are generally understood by those of ordinary skill in the art to which the invention pertains. Any term that is defined in a general dictionary shall be construed to have the same meaning in the context of the relevant art, and, unless otherwise defined explicitly, shall not be interpreted to have an idealistic or excessively formalistic meaning.

Hereinafter, some embodiments according to the present invention will be described in detail with reference to the accompanying drawings.

Figure 1:
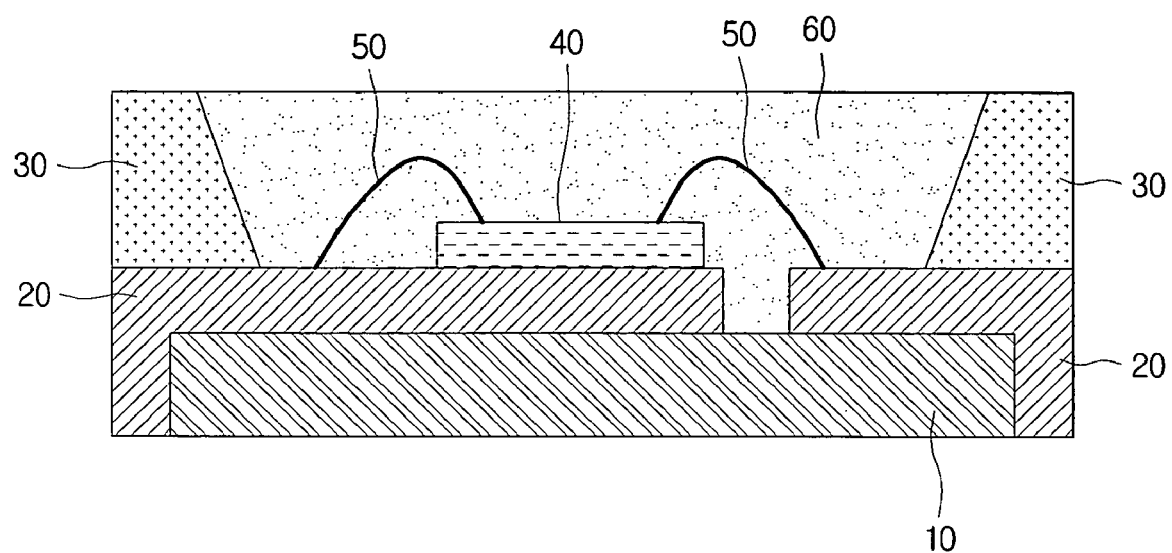
FIG. 1 illustrates a side view of the structure of an LED package adopting a lead frame structure according to the related art.
Figure 2:
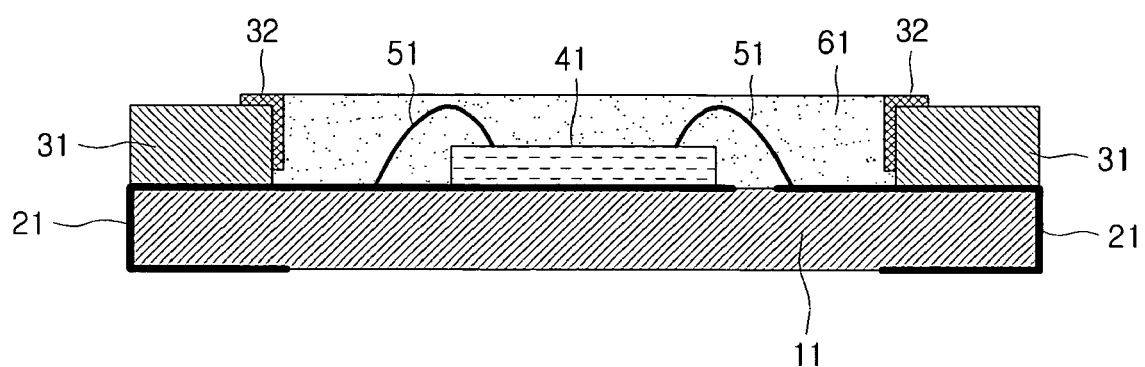
FIG. 2 illustrates a side view of the structure of an LED package using low temperature co-fired ceramic (LTCC) according to the related art.
Figure 3:
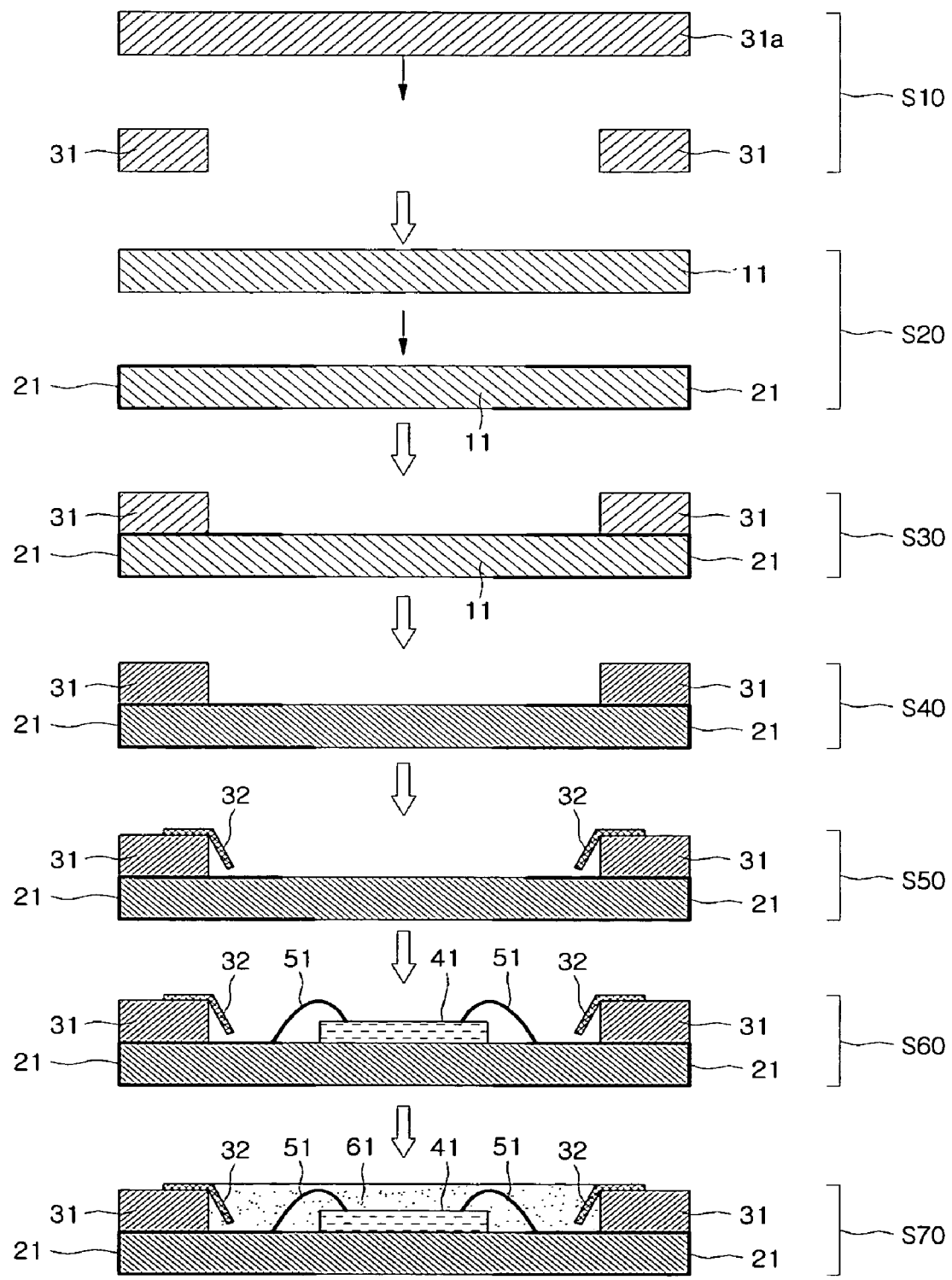
FIG. 3 illustrates a schematic flowchart of an LED package manufacturing method using LTCC according to the related art.
Figure 4:
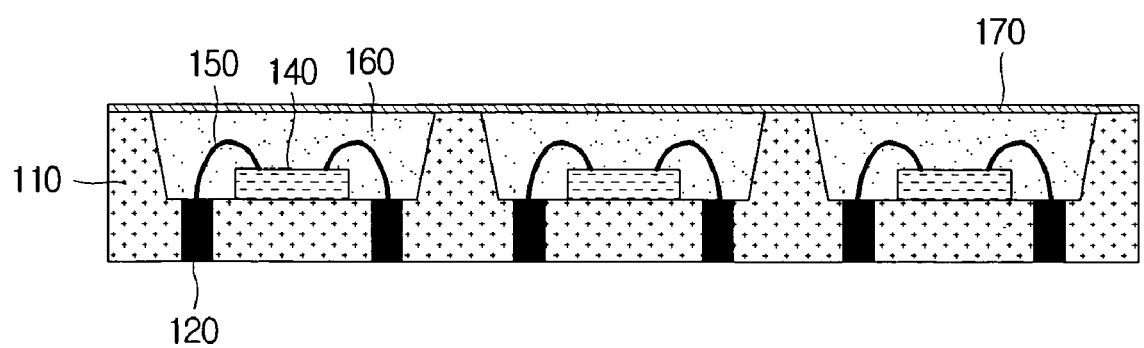
FIG. 4 illustrates a side view of the structure of an LED package according to a first embodiment of the present invention.
Figure 5A:
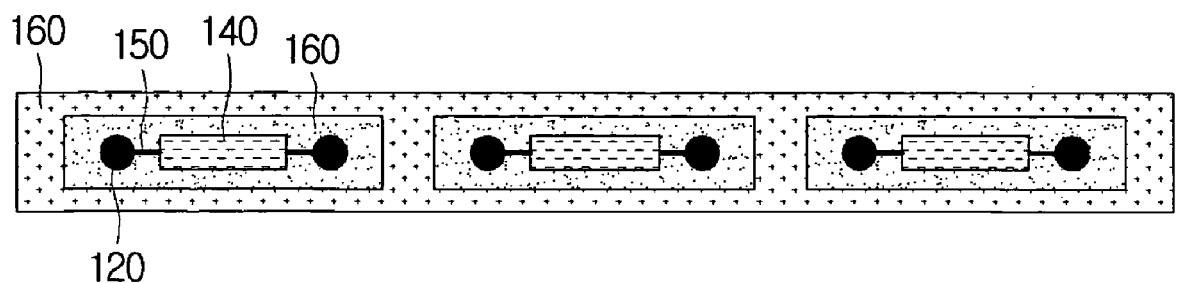
FIG. 5A illustrates a plan view showing the LED package illustrated in FIG. 4 when viewed from the top.
Figure 5B:
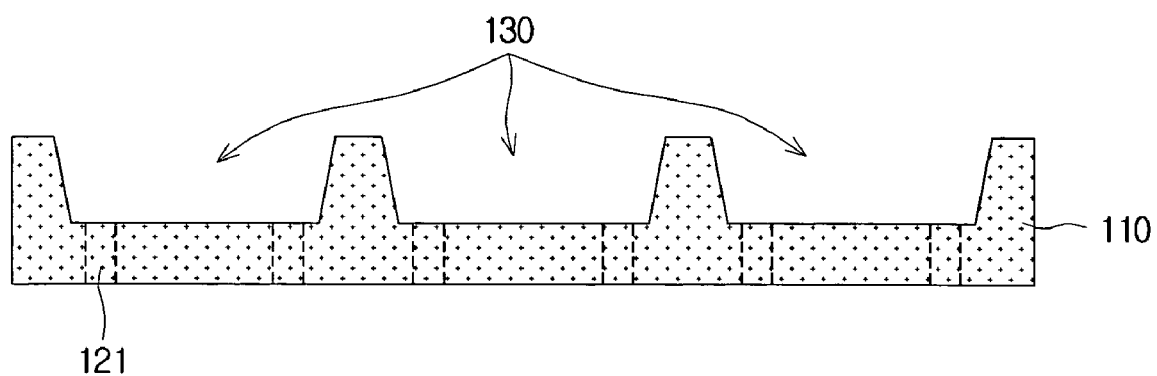
FIG. 5B illustrates a side view of only a package main body in the LED package illustrated in FIG. 4.
Figure 6:
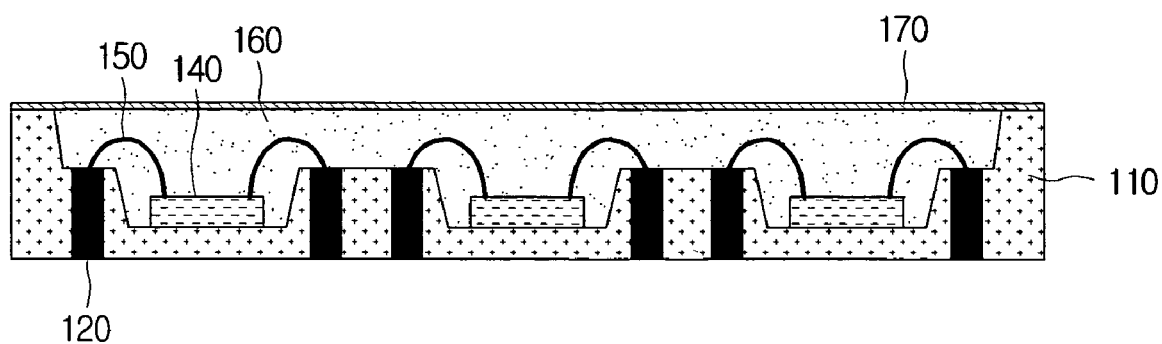
FIG. 6 illustrates a side view of the structure of an LED package according to a second embodiment of the present invention.

FIG. 4 illustrates a side view of the structure of an LED package according to a first embodiment of the present invention. FIG. 5A illustrates a plan view showing the LED package illustrated in FIG. 4 when viewed from the top. FIG. 5B illustrates a side view of only a package main body in the LED package illustrated in FIG. 4. FIG. 6 illustrates a side view of the structure of an LED package according to a second embodiment of the present invention.

Referring to FIGS. 4 and FIG. 5B, the LED package according to a first embodiment of the present invention includes a package main body 110, electrode 120, a light emitting diode chip 140, a bonding means 150, a molding part 160 and a fluorescent layer 170.

In this case, the electrode 120 is formed by passing through the package main body 110 in order to be connected to the external power supply. The light emitting diode chip 140 is mounted on the basal surface of each cavity 130 formed in the package main body 110, and is electrically connected to the electrode 120 through the bonding means 150. Accordingly, light emitting diode chip 140 performs the light emitting operation through the bonding means 150 and the electrode 120 in correspondence with the electric signal transmitted from the external power supply. The molding part 160 performs a function of fixing and sealing up the light emitting diode chip 140 and the bonding means 150. The fluorescent layer 170 is applied on the light emitting surface of the light emitting diode package so that the fluorescent layer improves the light emitting property or the light emission efficiency when a light beam generated according to the light emitting operation of the light emitting diode chip 140 is output to the outside of the package.

The elements mentioned above will be described in more detail in FIGS. 9A to 10D. In the light emitting diode package according to each embodiment of the present invention, since the package main body 110 has the significant characteristics, the material and shape that the package main body 110 has and molding method of the package main body 110 will be described in the following description.

In the first embodiment of the present invention, a plurality of cavities 130 are formed in a line on one surface of the package main body as illustrated in FIG. 5B so that the package main body 110 can be manufactured in the form of a bar type. In all the drawings of this document, while only three cavities are shown in the package main body for the convenience of the drawings, more cavities can be also formed in a line on one surface of the package main body.

Additionally, it can be easily understood from the following description that the package main body can be manufactured in various types including the bar type.

Since the light emitting diode chip 140 will be mounted on the basal surface of each cavity 130 formed in the package main body 110, there are following advantages when the package main body 110 is manufactured in the same form as that of the first embodiment of the present invention. First, in comparison with the conventional way of separately packaging each light emitting diode, productivity improvement such as reduction of the manufacturing time and manufacturing cost can be expected. For the similar reason, when the manufactured light emitting diode is applied as a side light emitting type backlight unit of the small-sized display device such as a mobile phone and a PMP and so on, the convenience of arranging and setting can be improved. Also, since it is possible to mount more numbers of light emitting diode chips within one package, there is an advantage in that the light emission intensity and the light emission efficiency of the light emitting diode package are more improved.

However, the related art had a difficulty in manufacturing the light emitting diode package in the form of a long bar type because a ceramic substrate has been used to manufacture the light emitting diode package. As described in the related art, since the ceramic substrate is thin and has a high possibility of being split or divided, that is, a crack, there has been a limitation to manufacture the light emitting diode package in the form of a bar type.

For that reason, thermoplastic polymer is used as a material of the package main body 110 in the first embodiment of the present invention. In this manner, when the package main body 110 is manufactured by using the thermoplastic polymer, it is possible to manufacture the package main body 110 in the form of a thin and long shape. In this case, the package main body 110 should constitute a basal surface of the light emitting diode package and perform as a supporter supporting the mounted light emitting diode chip so that the light emitting diode chip can stably stand on the basal surface. The package main body should also resist the heat generated from the operation of the light emitting diode chip. Therefore, it is necessary for the thermoplastic polymer to be used for manufacturing the package main body 110 to have the thermal resistance against high temperature and excellent mechanical strength.

The thermoplastic polymer having such a thermal resistance and mechanical strength includes polyetherimide (PEI) known as high functional engineering plastic materials, Polyethersulfone (PES), Polyetheretherketone (PEEK), polytetrafluoroethylene (PTFE) and liquid crystal polymer (LCP) and so on. Particularly, the LCP not only has excellent thermal resistance, excellent intensity, excellent dimension stability and excellent molding processibility, etc. but also is inexpensive, so that the LCP is very popular in the electronic component field among high functional engineering plastic materials.

The package main body 110 needs to easily conduct heat generated from the operation of the light emitting diode chip, because when the heat is not conducted normally, the temperature of the inside of the package rises so that the light emitting diode chip may malfunction, for example, the wavelength of the emitted light changes or the output thereof is unstable. Therefore, the package main body 110 of the first embodiment of the present invention can be manufactured with a thermoplastic/ceramic filler hybrid material that is made by adding the ceramic filler to the thermoplastic polymer. For example, when the package main body 110 is manufacture with a complex that is made by dispersing ceramic filler, such as fused silica ($SiO_2$), alumina ($Al_2O_3$) and boron nitride, which have excellent thermal conductivity and low thermal expansion property, within the thermoplastic polymer, this is greatly helpful for improving the heat conduction function of the manufactured light emitting diode package.

As described above, in order to manufacture the package main body 110 in the form of a long bar type by using the thermoplastic polymer, the first embodiment of the present invention uses a method of putting the thermoplastic polymer into a previously produced mold and of using a compression molding or an injection molding. Since the thermoplastic polymer (or the thermoplastic/ceramic filler hybrid material) is used as a material of the package main body 110, flexibility in which any of the compression molding method and the injection molding method can be applied in order to manufacture the package main body 110 is obtained.

For example, when the injection molding method is used to manufacture the package main body 110, the package main body 110 having the desired shape can be manufactured by heating and melting the thermoplastic polymer and by injecting the molten thermoplastic polymer into the previously produced mold having the same shape as that of the package main body 110 to be manufactured. When the compression molding method is used to manufacture the package main body 110, the package main body 110 having the desired shape can be manufactured by putting the powdered thermoplastic polymer into the previously heated mold and by compressing with a press and simultaneously heating the thermoplastic polymer.

Particularly, since the compression molding method has a low process cost as compared with the injection molding method and performs the molding process under high temperature and high pressure by using the press, it is possible to manufacture the package main body 110 having more excellent thermal resistance and mechanical strength by densely necking the molecules of the thermoplastic polymer powder. However, in the case of the injection molding method, it is also possible to increase the mechanical strength of the manufactured package main body 110 by considering the composite material that is made by adding glass clothes to the thermoplastic polymer.

As described above, in the first embodiment of the present invention, since the package main body 110 is manufactured through the compression molding or the injection molding by using the thermoplastic polymer (or a thermoplastic/ceramic filler hybrid material, a composite thereof with the glass clothes), there is an advantage that it is possible to manufacture the package main body 110 having various shapes and forms in accordance with the shape of the previously produced mold. In other words, in the present invention, since it is possible to simply change and modify the design of the package main body 110 to be manufactured by using the method of changing the mold design, there is no design limitation in manufacturing the package main body 110 according to the first embodiment of the present invention.

Also, for the similar reason, unlike either a conventional light emitting diode package using LTCC in which it is hard to increase the angle of orientation on account of the formation of the cavity in the manner of a punching/cutting method or a conventional light emitting diode package adopting a lead frame structure, it is possible conveniently to increase the angle of orientation of the light emitting diode package in the first embodiment of the present invention. Since the shape of the package main body 110 is determined according to the mold in the first embodiment of the present invention, there is no difficulty in forming an inclined plane on the side wall located at the boundary between cavities or in changing the height of the side wall. For example, in the case of a light emitting diode package according to a second embodiment of the present invention illustrated in FIG. 6, it can be easily seen that the angle of orientation can be increased by forming a side wall lower than the side wall of FIG. 4 between some two adjacent cavities in package main body 110.

In the past, when forming the cavity for acquiring the space for mounting the light emitting diode chip, complicated procedures, that is, the punching (or cutting) process, the lamination process and the firing process, had to be applied in the order specified. In the first embodiment of the present invention, since it is possible to manufacture the package main body having the cavity already formed by the compression molding method and so forth, a process simplification and a productivity improvement can be expected.

It is clear that the foregoing description of the exemplary embodiments of the material, shape, molding method, etc., with regard to the package main body 110 can be applied in the same or similar way to a light emitting diode package according to the following another embodiment of the present invention, any repetitive descriptions of the package main body 110 will be omitted in the following description.

Figure 7:
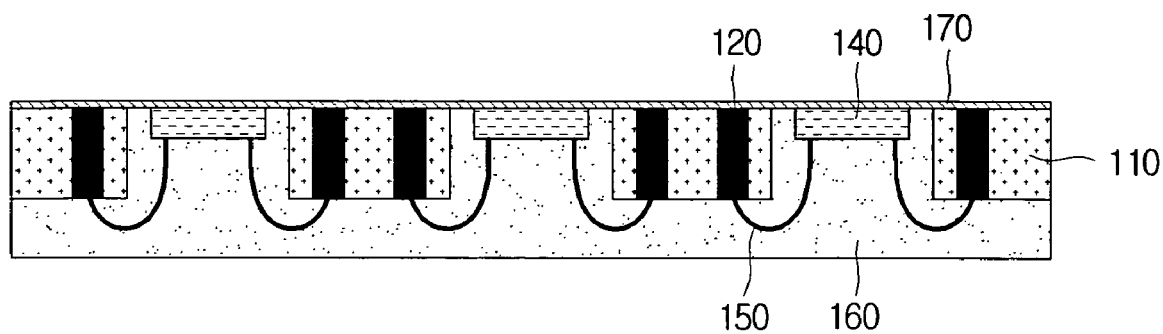
FIG. 7 illustrates a side view of the structure of an LED package according to a third embodiment of the present invention.
Figure 8:
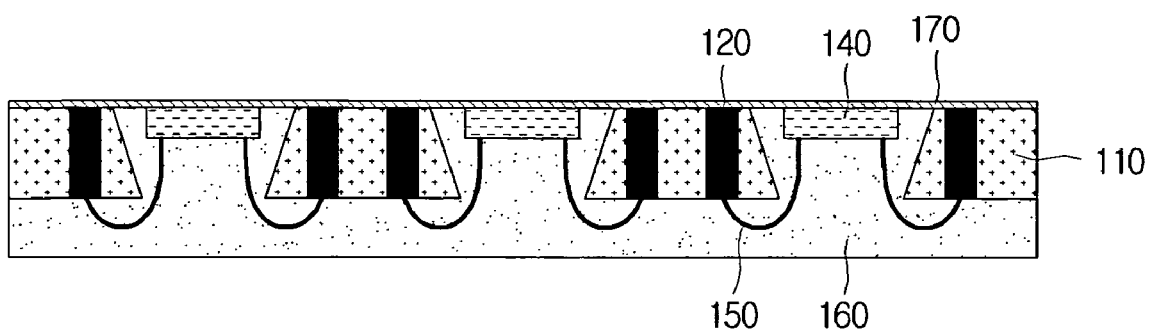
FIG. 8 illustrates a side view of the structure of an LED package according to a fourth embodiment of the present invention.

FIG. 7 illustrates a side view of the structure of an LED package according to a third embodiment of the present invention. FIG. 8 illustrates a side view of the structure of an LED package according to a fourth embodiment of the present invention.

Referring to FIGS. 7 and 8, a light emitting diode package according to a third embodiment and a fourth embodiment of the present invention also includes a package main body 110, an electrode 120, a light emitting diode 140, a bonding means 150, a molding part 160 and a fluorescent layer 170 identically to the light emitting diode package according to the first embodiment and the second embodiment of the present invention in FIGS. 4 and 6 described above.

The light emitting diode packages illustrated in FIGS. 7 and 8 has a different structure from that of the light emitting diode packages illustrated in FIGS. 4 and 6. This results from the difference between the light emitting surfaces that the light emitting diode packages include. The light emitting surfaces of FIGS. 4 and 6 are formed in the direction that the top surface of the light emitting diode chip 140 faces. In contrast, the light emitting surfaces of FIGS. 7 and 8 are formed in the direction that the basal surface of the light emitting diode chip 140 faces. For that reason, when the fluorescent layer 170 is applied on the light emitting surface, the light emitting surfaces of FIGS. 4 and 6 are formed on the molding part 160, and the light emitting surfaces of FIGS. 7 and 8 are formed on the basal surface of the cavity in which the light emitting diode chip 140 is mounted.

In FIGS. 7 and 8, since the light emitting surface is formed in the direction that the basal surface of the light emitting diode chip 140 faces so that the light is emitted from the basal surface to the upper direction, the light emitting diode chip is designated as a light emitting diode chip of bottom up structure. A light emitting diode package having such a bottom up structure has an advantage of no limit of the angle of orientation (light emitting angle) by the side wall located at the boundary between cavities 130.

The manufacturing method will be described with reference to an example of a case where the light emitting diode package has the bottom up structure of FIG. 7.

FIGS. 9A to 9D illustrate a schematic flowchart of a manufacturing method of an LED package illustrated in FIG. 7. FIGS. 10A to 10D illustrate plan views showing an LED package in the manufacturing process corresponding to each of procedures illustrated in FIGS. 9A to 9D when viewed from the top. FIGS. 9A to 9D illustrate sections produced by cutting on the basis of the X-X' line in FIGS. 10A to 10D.

Figure 9A:
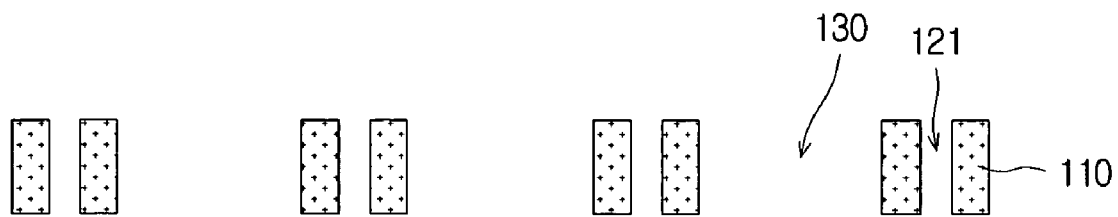
FIGS. 9A to 9D illustrate a schematic flowchart of a manufacturing method of the LED package illustrated in FIG. 7.
Figure 10A:
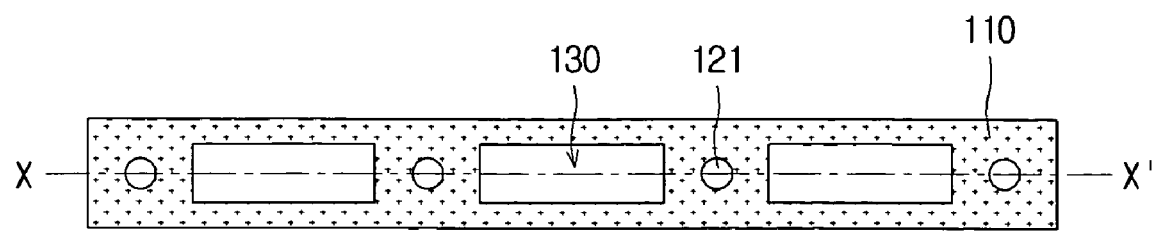
FIGS. 10A to 10D illustrate plan views showing an LED package in the manufacturing process corresponding to each of procedures illustrated in FIGS. 9A to 9D when viewed from the top.

Referring to FIGS. 9A and 10A, a package main body 110 in which a plurality of through portions 130 are formed in a line is manufactured. The package main body, as described above, can be manufactured by the method of putting the thermoplastic polymer into a mold produced to fit the corresponding shape and by using a compression molding method or an injection molding method.

In this case, in the shapes of the package main body 110 illustrated in FIGS. 9A and 10A, the package main body of FIGS. 9A and 10A features that it has a plurality of through portions having two open sides, unlike the package main body of FIGS. 4 or 6 having a plurality of cavities. Because the light emitting diode package illustrated in FIG. 7 has the bottom up structure unlike the light emitting diode packages illustrated in FIG. 4 or FIG. 6, the package main body of FIGS. 9A and 10A includes the through portion instead of the cavity. Since any one side of the through portion formed in this step will be closed through the following steps (see FIGS. 9D and 10D) so that a shape of cavity will be obtained in the finally manufactured package, the through portion and the cavity are expressed by the same reference number.

A through hole 121 is further formed in the package main bodies 110 illustrated in FIGS. 9A and 10A, including the plurality of the through portion 130. The through hole 121 is manufactured for the sake of electrode formation. In the manufacturing process of the package main body 110, the through hole 121 can be simultaneously molded in correspondence with a position where the electrode 120 is intended to be formed. On the other hand, aside from the manufacture of the package main body 110, it will be apparent that the through hole 121 can be also formed by a drilling process such as a mechanical processing or a laser processing.

Figure 9B:
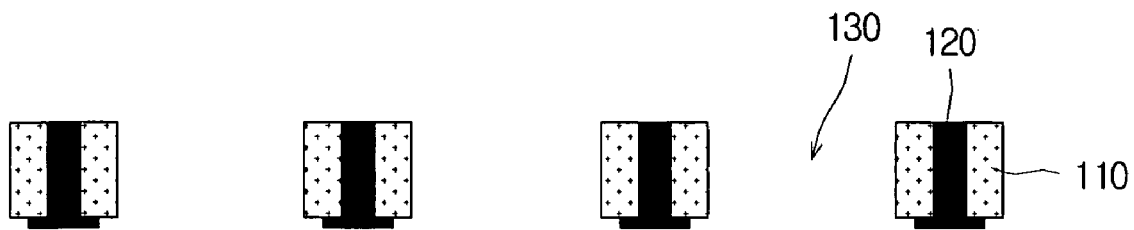
Figure 10B:
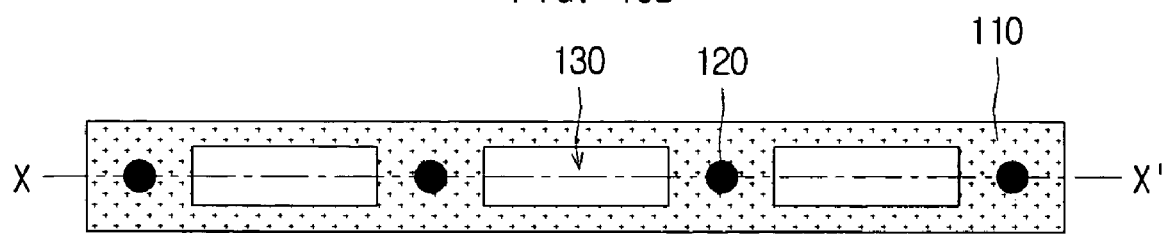

Referring to FIGS. 9B and 10B, the electrode 120 is formed by using conductive substance into the through hole 121. In order to form the electrode 120, a general method, such as a method of charging the inside of the through hole 121 with electrically conductive paste, or a method of thinly gilding the inner wall of the through hole 121, can be used as it stands. In this case, an electrode pad should be also formed at one end of the electrode 120.

Figure 9C:
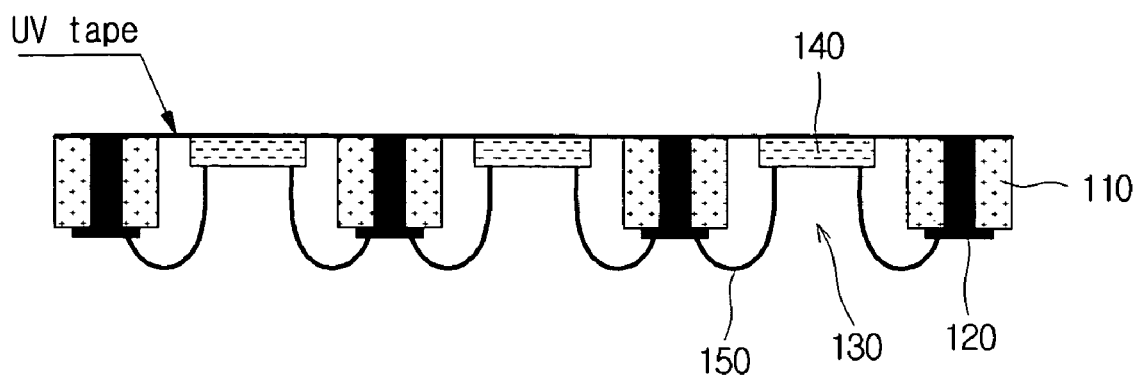
Figure 10C:
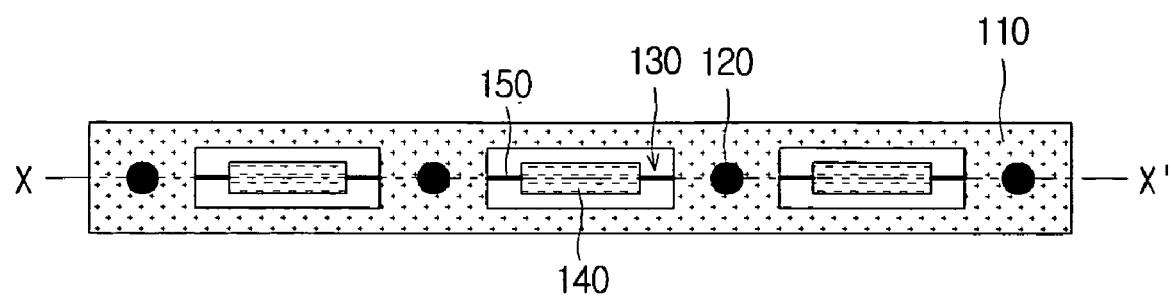

Referring to FIGS. 9C and 10C, an adhesive tape (for example, a UV tape illustrated in FIGS, etc.) is adhered to any one side of the package main body 110 because any one open side of each through portion 130 is converted into a closed side by closing the one open side, so that a space for mounting the light emitting diode chip 140 and the mounting surface are provided. Accordingly, the light emitting diode chip 140 is mounted on the mounting surface newly provided by the adhesive tape.

Subsequently, the light emitting diode chip 140 is electrically connected to the electrode 120 by the bonding means 150. While the drawing shows a case where a wire bonding is performed by using a wire as a bonding means 150, it is obvious that various bonding method including a flipchip bonding can be used.

Figure 9D:
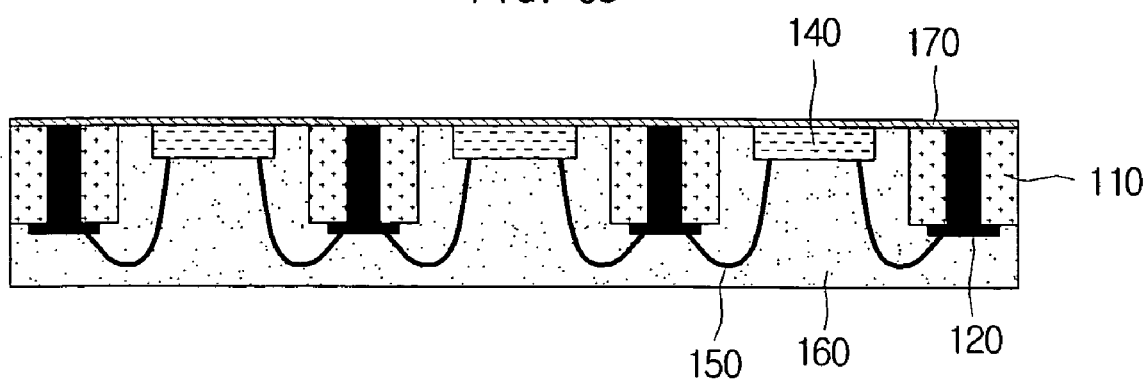
Figure 10D:
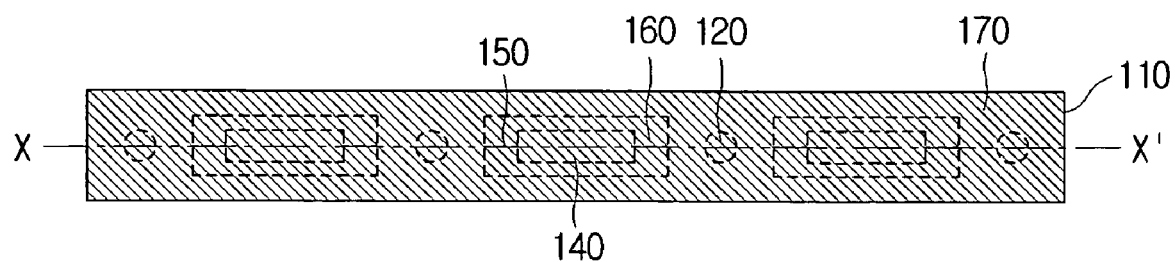

Referring to FIGS. 9D and 10D, the light emitting diode chip 140 and the bonding means 150 are sealed by using the molding resin 160 in order to protect the light emitting diode chip 140, to preserve the shape of the bonding means 150 and to prevent separation and breakaway. Generally, a transparent silicon resin, an Epoxy molding compound (EMC), etc., are used as the molding resin 160. The molding resin mixed with fluorescent materials can be used for improving the light emitting property or the light emission efficiency.

After the light emitting diode chip 140 and the bonding means 150 are fixed and sealed through the process mentioned above, the adhesive tape adhered to the package main body is removed. Since the light emitting diode chip 140 and the bonding means 150 is fixed and sealed by the molding resin 160, their original shapes can be maintained even though the adhesive tape is removed. Thus, the adhesive tape is removed because the surface to which the adhesive tape is adhered (that is, the basal surface of the light emitting diode chip 140) constitutes the light emitting surface in the light emitting diode package having the bottom up structure. So long as the adhesive tape is made of light-transmitting material, it is not necessary to remove the adhesive tape. The surface from which the adhesive tape is removed can be applied by the fluorescent substance 170. As described above, the fluorescent substance 170 is applied on the light emitting surface so that the fluorescent substance helps the light emitting property and the light emission efficiency of the light emitting diode package improve.

While the manufacturing method of the light emitting diode package having the bottom up structure illustrated in FIG. 7 has been described in FIGS. 9A to 10D, many parts of the manufacturing method can be also similarly applied to manufacturing the light emitting diode packages illustrated in FIGS. 4 and 6. Since the light emitting diode packages illustrated in FIGS. 4 and 6 does not have the bottom up structure unlike the light emitting diode packages illustrated in FIGS. 7 and 8, parts of descriptions of FIGS. 9A to 10D that are not identical to the descriptions of FIGS. 4 and 6 (formation of the through portion, adhesion and removal of the adhesive tape, description of position of applying the fluorescent substance) should be reinterpreted in accordance with the structures of the light emitting diode packages illustrated in FIGS. 4 and 6. However, since those skilled in the art can easily analogize the parts through the structures of the packages illustrated in FIGS. 4 and 6, additional description thereabout will be omitted.

While the present invention has been described with reference to exemplary embodiments thereof, it will be understood by those skilled in the art that various changes and modification in forms and details may be made without departing from the spirit and scope of the present invention as defined by the appended claims.

What is claimed is:

1. A light emitting diode package manufacturing method comprising:
    manufacturing a package main body having a plurality of cavities, the cavities being formed in a line on one surface, through molding by putting thermoplastic polymer into a previously produced mold, and a through hole is formed in correspondence with a position of an electrode intended to be formed in the package main body, the through hole being molded simultaneously with the package main body in the manufacturing the package main body;
    forming the electrode passing through the package main body;
    mounting a light emitting diode chip on a basal surface of the each cavity formed in the package main body;
    connecting electrically the light emitting diode chip and the electrode by using a bonding means; and
    sealing the light emitting diode chip and the bonding means by using a molding resin.

2. The manufacturing method of claim 1, wherein the package main body is manufactured by putting powdered thermoplastic polymer into the mold and by using a compression molding method.

3. The manufacturing method of claim 1, wherein the package main body is manufactured by putting molten thermoplastic polymer into the mold and by using an injection molding method.

4. The manufacturing method of claim 1, wherein the package main body is molded and manufactured such that an inclined plane is formed on a side wall located between some two adjacent cavities thereof.

5. The manufacturing method of claim 1, wherein the thermoplastic polymer corresponds to one of materials such as liquid crystal polymer (LCP), polyetherimide (PEI), polyethersulfone (PES), polyetheretherketone (PEEK) and polytetrafluoroethylene (PTFE).

6. The manufacturing method of claim 1, wherein the package main body is formed of the thermoplastic polymer with the addition of ceramic filler.

7. The manufacturing method of claim 1, further comprising applying fluorescent substance on an upper side of the molding resin.

8. The manufacturing method of claim 1, wherein the package main body is manufactured in the form of a bar type, whereas the plurality of cavities are formed in a line on one surface of the package main body.

9. A light emitting diode package manufacturing method comprising:
    manufacturing a package main body having a plurality of through portions, the through portions being formed in a line, through molding by putting thermoplastic polymer into a previously produced mold;
    forming an electrode passing through the package main body at a different position from a position of formation of the through portion;
    adhering an adhesive tape to one surface of the package main body such that a closed side is formed to one side of each through hole;
    mounting a light emitting diode chip on the closed side formed in each through portion;
    connecting electrically the light emitting diode chip and the electrode by using a bonding means; and
    sealing the light emitting diode chip and the bonding means by using a molding resin.

10. The manufacturing method of claim 9, wherein the package main body is manufactured by putting powdered thermoplastic polymer into the mold and by using a compression molding method.

11. The manufacturing method of claim 9, wherein the package main body is manufactured by putting molten thermoplastic polymer into the mold and by using an injection molding method.

12. The manufacturing method of claim 9, further comprising, before forming the electrode, forming a through hole at a position of the electrode intended to be formed in the package main body through a drilling process.

13. The manufacturing method of claim 9, wherein a through hole is formed in correspondence with the position of the electrode intended to be formed in the package main body, whereas the through hole is molded simultaneously with the package main body in a manufacturing process of the package main body.

14. The manufacturing method of claim 9, wherein the thermoplastic polymer corresponds to one of materials such as liquid crystal polymer (LCP), polyetherimide (PEI), polyethersulfone (PES), polyetheretherketone (PEEK) and polytetrafluoroethylene (PTFE).

15. The manufacturing method of claim 9, wherein the package main body is formed of the thermoplastic polymer with the addition of ceramic filler.

16. The manufacturing method of claim 9, further comprising, after sealing the light emitting diode and the bonding means, removing the adhesive tape and applying fluorescent substance on a surface from which the adhesive tape is removed.

17. The manufacturing method of claim 9, wherein the package main body is manufactured in the form of a bar type, whereas the plurality of through portions are formed in a line in the package main body.

* * * * *